United States Patent [19]

Kuroda

[11] Patent Number: 4,622,520
[45] Date of Patent: Nov. 11, 1986

[54] FM DEMODULATOR WITH IMPULSE NOISE ELIMINATION CIRCUIT

[75] Inventor: Kazuo Kuroda, Tokorozawa, Japan

[73] Assignee: Pioneer Electronic Corporation, Tokyo, Japan

[21] Appl. No.: 666,455

[22] Filed: Oct. 30, 1984

[30] Foreign Application Priority Data

Nov. 1, 1983 [JP] Japan ............... 58-169551[U]

[51] Int. Cl.[4] .................. H03D 3/00; H04N 5/213
[52] U.S. Cl. ..................... 329/112; 329/134; 455/223; 455/309; 455/312; 358/336; 358/167
[58] Field of Search ............... 329/110, 112, 131, 132, 329/134; 455/210, 222, 223, 227, 296, 307, 308, 309, 312; 360/30; 358/336, 167, 177

[56] References Cited

U.S. PATENT DOCUMENTS 3,671,867  6/1972  Schwarz ............... 455/308 X
4,151,471  4/1979  Packard et al. ........ 455/296 X
4,462,048  7/1984  Ross .................. 358/336

Primary Examiner—Siegfried H. Grimm
Attorney, Agent, or Firm—Schwartz, Jeffery, Schwaab, Mack, Blumenthal & Evans

[57] ABSTRACT

An apparatus for demodulating a frequency modulated input signal having a carrier signal component, including a filter for allowing only signals having frequency around the frequency of the carrier signal component and a demodulator connected to the filter for performing frequency demodulation, is provided with a noise eliminating circuit at a stage immediately before the filter. With this provision, an impulse noise having spectrum components of very wide band and which could not be rejected by the filter in prior art apparatuses, is eliminated before the demodulation.

4 Claims, 6 Drawing Figures

FM DEMODULATOR WITH IMPULSE NOISE ELIMINATION CIRCUIT

BACKGROUND OF THE INVENTION

1. Field of the Invention

The present invention relates to FM (frequency modulation) signal demodulating apparatuses, and more particularly to an improvement of FM signal demodulating apparatuses having a filter circuit for picking up a carrier signal component from a predetermined input signal.

2. Description of Background Information

In apparatuses for demodulating a frequency modulated input signal, such as an audio signal playback circuit for a video disc player system to which a frequency modulated pickup output signal is applied, filter circuits are generally provided for selectively permitting a signal having frequency around a carrier frequency before a demodulation stage of the frequency modulated input signal. However, if an impulse noise disturbance occurs in the input signal of such an apparatus, there will be a failure of the carrier signal. As an example, the carrier signal will be subject to a strong phase modulation while passing through the filter circuit due to the presence of the impulse noise which has a noise spectrum of very wide band, and also passes through the filter circuit. As a result, the quality of the demodulation signal will be greatly degraded by the presence of considerable amount of noise components.

SUMMARY OF THE INVENTION

An object of the present invention is therefore to alleviate the problem of the conventional apparatuses and to provide an FM signal demodulating apparatus which can produce an FM demodulation signal with less noise components even if an impulse noise is mixed to an input signal of the apparatus.

According to the present invention, an FM signal demodulation apparatus having a filter circuit for picking up a carrier frequency signal is provided with a noise eliminating means for eliminating the impulse noise at a stage before the filter circuit for picking up the carrier frequency signal.

Further scope of applicability of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Figure 1:
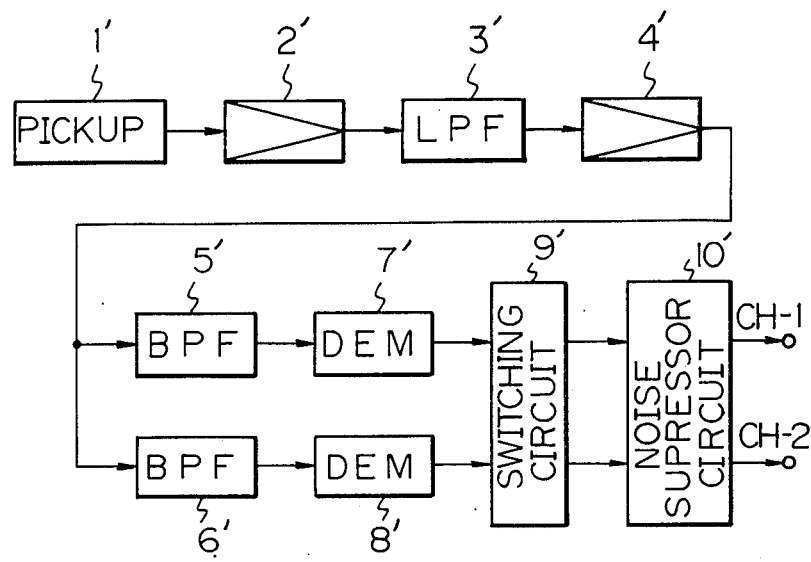
FIG. 1 is a block diagram of a conventional frequency modulation signal demodulating apparatus which is used in a playback circuit of a video disc player system.

Before entering into the explanation of the embodiments of the present invention, reference is first made to the block diagram of FIG. 1, in which an example of a conventional FM demodulator circuit of this sort is illustrated.

The circuit of FIG. 1 is to be used in a Video Disc Player (VDP) system for reproducing information recorded on a recording disc used as a record medium. In the figure, an FM-RF (FM Radio Frequency) signal is picked up by a pickup 1'. The output signal of the pickup 1' is then applied to a low pass filter (LPF) 3' through a head amplifier 2'. In the LPF 3', only a signal component corresponding to audio information is picked up from a frequency multiplex record signal of video information and audio information. The audio information from the LPF 3' is amplified in the amplifier 4' and in turn applied to a pair of Band Pass Filters (BPFs) 5' and 6' respectively.

This audio information is a two-channel signal and carrier signals of 2.3 MHz and 2.8 MHz are utilized. Specifically, in a recording system, the frequency of carrier signals are previously modulated by corresponding audio signals. Therefore, the carrier signal of each channel signal is separately picked up by the BPF 5' or 6'. Each carrier signal is then respectively supplied to an FM demodulator 7' or 8' in which the FM demodulation takes place. Further, the output signal of the FM demodulators 7' and 8' are supplied to a switching circuit 9' so that the signals are treated by a switching process according to the mode of the signals, for example, stereo or monaural. After passing through these circuits, the signals are supplied to a noise suppressor circuit 10' and in turn output as audio output signals.

However, as mentioned before, if an impulse noise having an amplitude greater than the level of the audio carrier signal is mixed in with the pickup output signal, the impulse noise will be applied to each BPF 5' or 6' with the input signal. Since the impulse noise has spectrum components over an extremely wide band, the impulse noise passes through the BPFs 5', 6' and the carrier signal is subjected to a great amount of phase modulation while it passes through the BPFs 5', 6'. As a result, the demodulated FM signal will include a considerable amount of noise component.

Figure 2:
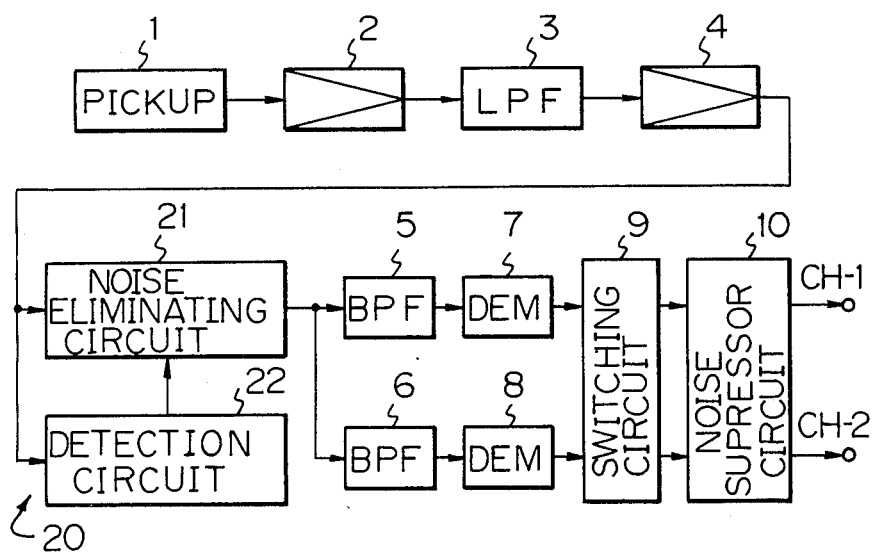
FIG. 2 is a block diagram of a first embodiment of the FM signal demodulation apparatus according to the present invention.

An embodiment of the FM signal demodulator of the present invention will be described more in detail with reference to FIG. 2 hereinafter.

This embodiment is so designed as to be used for processing a pickup output signal of the VDP (Video Disc Player). In the similar manner as the conventional arrangement of FIG. 1, a pickup output signal of a pickup such as an optical pickup unit is applied to a head amplifier 2 and in turn applied to a Low Pass Filter (LPF) 3. In the LPF 3, only an audio signal component is picked up from a frequency multiplex signal of a video signal and an audio signal. An output signal of the LPF 3 is then applied to an amplifier 4 in which the input signal is amplified. An output signal of the amplifier 4 is in turn applied to an impulse noise eliminating means 20. As shown, this means for eliminating the impulse noise is made up of a noise eliminating circuit 21 inserted in the signal line and a detector circuit 22 for detecting the level of the carrier signal at an input terminal of the noise eliminating circuit 21. The detector circuit 22 is also designed to detect the magnitude of the noise component if an impulse noise having the magnitude greater than the level of the carrier signal arrives. In such a case, the noise eliminating circuit 21 is activated by means of the detection circuit 22. An output signal of the noise eliminating circuit 21 is then applied to a pair of band pass filters (BPF)s 5 and 6 by which the carrier signal of each channel having the frequency of 2.3 MHz or 2.8 MHz is respectively selectevely separated. The carrier signals respectively picked up in the BPFs 5 and 6 are then applied to a pair of FM demodulators 7 and 8 in which the FM demodulation process takes place. Output signals of the FM demodulators 7 and 8 are then applied to a switching circuit 9 in which the input signals are treated by a suitable switching process depending on the mode of the input signal, i.e., the stereo or monaural. An output signal of the switching circuit 9 is then applied to a noise suppressor circuit 10, and thus audio signals of each channel are provided.

Figure 3:
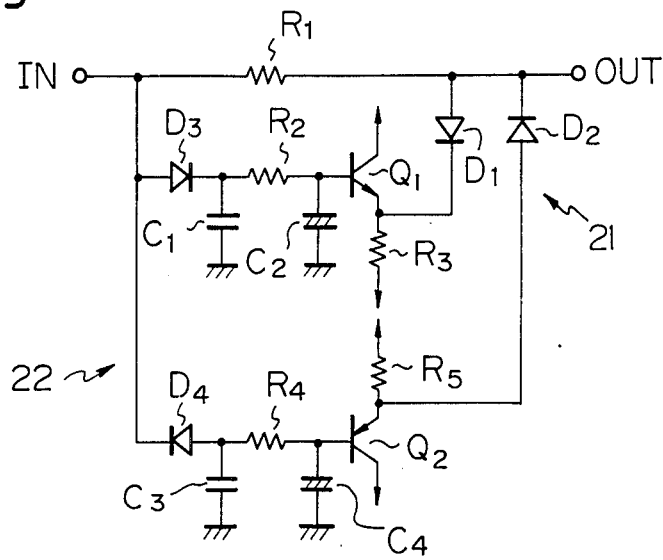
FIGS. 3 and 4 are circuit diagrams respectively showing an example of noise eliminating means of FIG. 2.

FIG. 3 shows an example of detailed construction of the noise eliminating circuit 21 and the carrier level detection circuit 22. The carrier level detection circuit 22 is constructed to rectify and smooth the carrier signal currents of normal direction and reverse direction. Specifically, the carrier signal current of normal direction is rectified and smoothed by means of a circuit portion including a diode $D_3$, a resistor $R_2$, and capacitors $C_1$ and $C_2$. Also, the carrier signal current of reverse direction is rectified and smoothed by means of a circuit portion including a diode $D_4$, a resistor $R_4$, and a pair of capacitors $C_3$ and $C_4$.

By means of an emitter follower circuit of a transistor $Q_1$ and a resistor $R_3$, a diode $D_1$ for cutting off the noise component of normal direction is controlled between a conducting state and a non-conducting state. Similarly, a diode $D_2$ for cutting off the noise component of reverse direction is controlled between a conducting state and a non-conducting state by an emitter follower circuit of a transistor $Q_2$ and a resistor $R_5$. In addition, the input signal also passes through a series resistor $R_1$ which is inserted in the signal line between an input terminal and an output terminal.

In operation, the capacitors $C_2$ and $C_4$ are charged respectively in the normal direction and reverse direction by the carrier signal. In this state, if an impulse noise of normal direction whose magnitude is greater than the charging potential of the normal direction of the capacitor $C_2$ arrives, then the diode $D_1$ turns on and the level of this noise signal will be reduced. Similarly, if an impulse noise of reverse direction whose level is greater than the charging potential of the reverse direction of the capacitor $C_4$ arrives, then the diode $D_2$ turns on and the level of the noise signal will be reduced.

Figure 4:
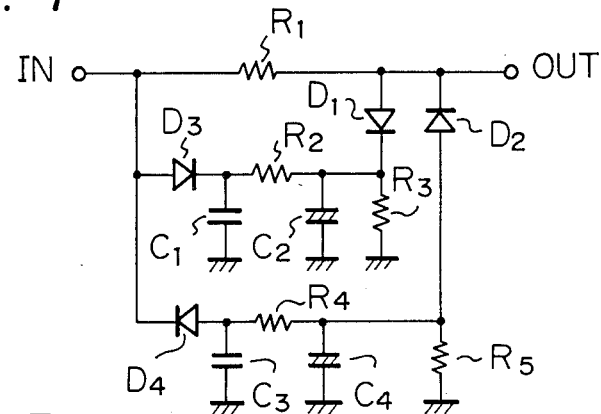

FIG. 4 illustrates another example of the noise eliminating circuit 21 and the carrier level detection circuit 22. In this figure, like reference numerals used in FIG. 3 denote like parts and explanation thereof is omitted. This example is characterized in that the circuit construction is simplified by directly applying the charging potentials of the capacitors $C_2$ and $C_4$ to the diodes $D_1$ and $D_2$ as the bias voltages.

With this circuit construction, the absolute value of the power of the impulse noise which has the spectrum of a very wide range will be greatly reduced. Therefore, the abrupt phase modulation of the audio carrier signal which has passed through the BPF of the next stage will be remarkably reduced. As a result, the FM demodulation signal will contain practically no noise component.

Further, it is to be noted that the location of the noise eliminating means, that is, the stage before the BPFs 5 and 6 is very important for the efficiently reducing the noise component. For instance, if the noise eliminating means is disposed in the stage after the BPFs 5 and 6, that is, the stage directly before the FM demodulated, the spectrum component of the noise will become very broad band due to the limiting operation of this noise eliminating means, and at the same time the power of the noise component will be greatly increased. Thus, it is essential to place the noise eliminating means in the stage before the BPFs 5 and 6.

Figure 5:
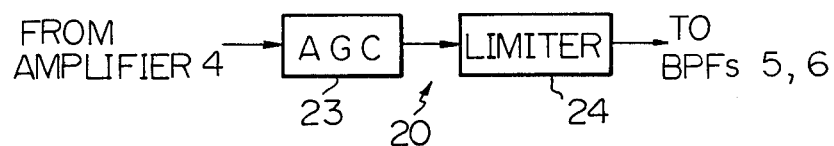
FIG. 5 is a block diagram of a second embodiment of the FM signal demodulation apparatus according to the present invention.

FIG. 5 shows the second embodiment of the present invention, and especially illustrates a variation of the noise eliminating means 20. As shown, the output signal of the amplifier 4 is applied to a limiter circuit 24 through an automatic gain control (AGC) circuit 23. an output signal of this limiter circuit 24 will then be applied to the BPFs 5 and 6. By means of the gain control operation of the AGC circuit 23, the level of the carrier signal is made uniform; further, the variation of the amplitude of the carrier signal which was not corrected by the AGC circuit 24 will be limited by the limiter circuit 24. By this provision, the amplitude of the impulse noise is greatly reduced to decrease the energy of the impulse noise.

Figure 6:
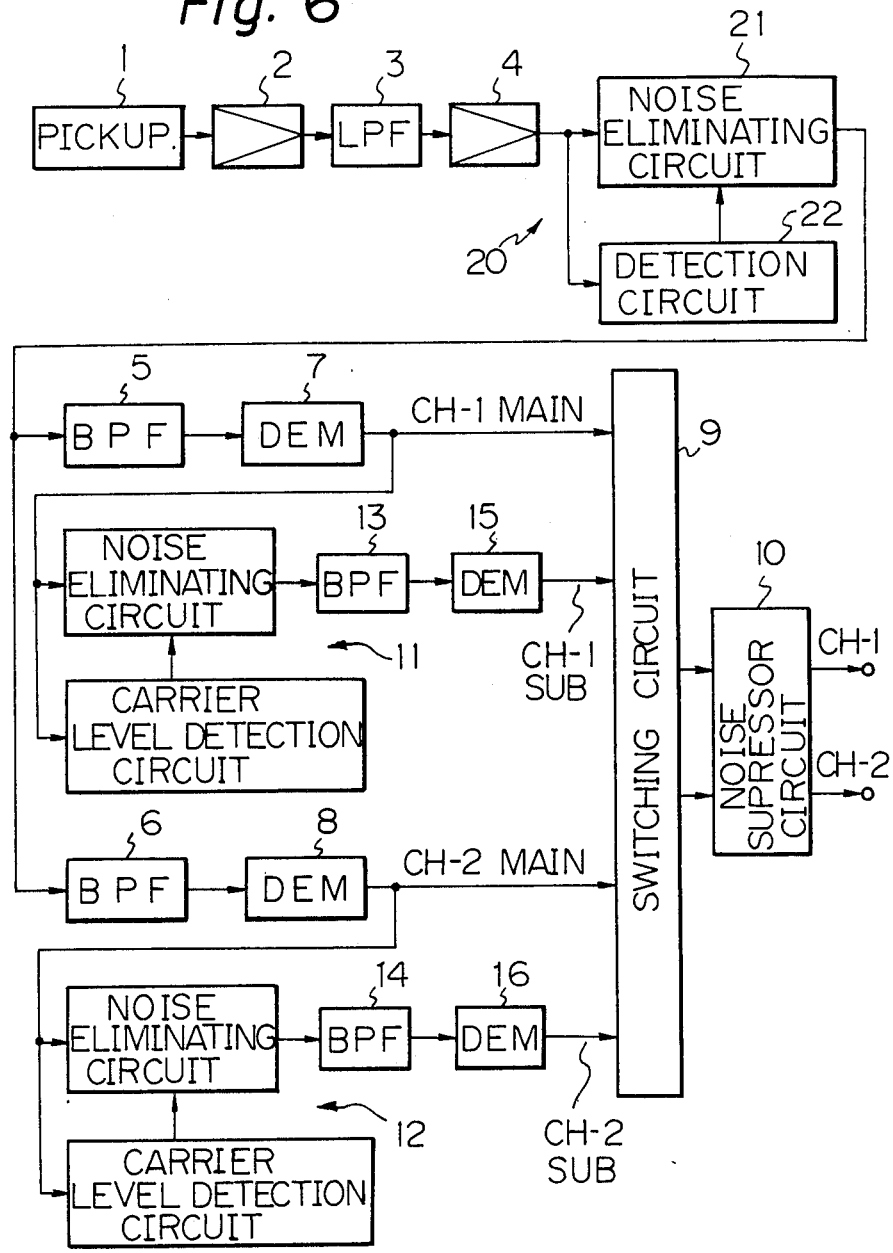
FIG. 6 is a block diagram of a third embodiment of the FM signal demodulation apparatus according to the present invention.

FIG. 6 is a block diagram of the other embodiment of the FM demodulator of the present invention, in which like reference numeral indicate like parts. This embodiment is designed for processing a four channel audio information. The frequency multiplex recording system for the four channel signals is, for example, described in Japanese patent application No. 57-191110 of the same assignee, in which a subcarrier signal whose frequency is slightly higher than the audio frequency band, for example 47.2 kHz, is frequency modulated by subchannel audio signals to be added to form a multiplex signal. The thus produced FM subcarrier signal is then added to a main audio signal to form a signal for the frequency modulation of the main carrier signal of 8.3 MHz. The same frequency multiplex operation is also effected in the other channel 2.

FIG. 6 shows an example in which the FM demodulator of the present invention is adapted in such a four channel audio information playback system. As shown, the noise eliminating means 20 is disposed in the stage immediately before the BPFs 5 and 6. Further a noise eliminating means 11 is connected to a demodulator 7 of the main signal of channel 1, and a noise eliminating means 12 is connected to a demodulator 8 of the main signal of channel 2. The output signals of the noise eliminating means 11 and 12 are then supplied respectively to a BPF 13 and BPF 14 for picking up sub carrier signal (47.2 kHz). The sub channel audio signals are then reproduced by demodulating the output signals of BPFs 13 and 14 at FM demodulators 15 and 16 respectively. These four demodulation signals are supplied to a switching circuit in which appropriate selection of the demodulation signal is performed depending on the predetermined output mode.

Since the impulse noise is removed also in this embodiment, there is no concern that unwanted output noise is produced by the impulse noise.

Further, in this embodiment, the circuit construction of either FIG. 3 or FIG. 4 can be used for the noise eliminating circuits 11, 12 and 20.

It will be appreciated from the foregoing, that according to the present invention, the impulse noise of a magnitude greater than that of the carrier signal of the FM signal is removed at a stage before the BPF for picking up the carrier signal. Therefore, the band width of the spectrum of this impulse noise and the power thereof are reduced. Thus an FM demodulation signal which is free of the pulse noise will be produced.

Although the above explanation is made by way of example of a video disc player (VDP), it is needless to say that the present invention is applicable to all other kinds of apparatus in which a frequency modulated input signal is supplied to a filter circuit and in turn applied to a demodulating stage.

What is claimed is:

1. An apparatus for demodulating a frequency modulated input signal having a carrier signal component of a predetermined frequency, comprising:
    a noise eliminating means for respectively detecting a positive impulse noise and a negative impulse noise which may be mixed with said frequency modulated input signal, and eliminating each of said positive and negative impulse noises from said frequency modulated input signal;
    a filter means connected to said noise eliminating means, for permitting signals within a frequency band around said carrier signal component to pass therethrough; and
    demodulator means connected to said filter means, for performing a frequency demodulation of an output signal of said filter means.

2. An apparatus as set forth in claim 1, wherein said noise eliminating means comprises a first reference level generating circuit means connected to receive said frequency modulated input signal for generating a positive reference signal from said carrier signal component, a second reference level generating circuit means connected to said frequency modulated input signal for generating a negative reference signal from said carrier signal component, a first noise eliminating circuit means connected to receive said frequency modulated input signal and responsive to said positive reference signal for controlling a positive side amplitude of said frequency modulated input signal when an instantaneous positive level of said frequency modulated input signal becomes higher than a level of said positive reference signal, and a second noise eliminating circuit means connected to receive said frequency modulated input signal and responsive to said negative reference signal for controlling a negative side amplitude of said frequency modulated input signal when an instantaneous negative level of said frequency modulated input signal becomes lower than a level of said negative reference signal.

3. A frequency modulated audio signal demodulating apparatus to be used in a video disc player system having a pickup for generating an audio-video composite signal, said frequency modulated audio signal having a carrier signal component of a predetermined frequency, comprising:
    a first filter means connected to said audio-video composite signal, for rejecting a video signal component of said audio-video composite signal;
    a noise eliminating means connected to said first filter means for respectively detecting a positive impulse noise and a negative impulse noise which may be mixed with an output signal of said first filter means, and eliminating each of said positive and negative impulse noises from said output signal of said first filter means;
    a second filter means connected to said noise eliminating means, for permitting signals within a frequency band around said carrier signal component to pass therethrough; and
    a demodulator means connected to said second filter means, for performing a frequency demodulation of an output signal of said second filter means.

4. An apparatus as set forth in claim 3, further comprising:
    a second noise eliminating means connected to said demodulator means for respectively detecting a positive impulse noise and a negative impulse noise which may be mixed with an output signal of said demodulator means, and eliminating each of said positive and negative impulse noises from said output signal of said demodulator means;
    a third filter means connected to said second noise eliminating means, for permitting signals within a frequency band around a second carrier signal component to pass therethrough; and
    a second demodulator means connected to said third filter means, for performing a frequency demodulation of an output signal of said third filter means.

* * * * *